US011640897B2

(12) United States Patent
Hirano et al.

(10) Patent No.: US 11,640,897 B2
(45) Date of Patent: May 2, 2023

(54) CHARGED PARTICLE BEAM DEVICE (71) Applicant: Hitachi High-Technologies Corporation, Tokyo (JP)

(72) Inventors: Ryo Hirano, Tokyo (JP); Tsunenori Nomaguchi, Tokyo (JP); Chisato Kamiya, Tokyo (JP); Junichi Katane, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 561 days.

(21) Appl. No.: 16/641,870

(22) PCT Filed: Sep. 4, 2017

(86) PCT No.: PCT/JP2017/031789
§ 371 (c)(1),
(2) Date: Feb. 25, 2020

(87) PCT Pub. No.: WO2019/043946
PCT Pub. Date: Mar. 7, 2019

(65) Prior Publication Data
US 2020/0251304 A1 Aug. 6, 2020

(51) Int. Cl.
*H01J 37/28* (2006.01)
*H01J 37/141* (2006.01)
(Continued)

(52) U.S. Cl.
CPC .......... *H01J 37/28* (2013.01); *H01J 37/1413* (2013.01); *H01J 37/20* (2013.01); *H01J 37/244* (2013.01);
(Continued)

(58) Field of Classification Search
CPC ........ H01J 37/14; H01J 37/141; H01J 37/143; H01J 37/244; H01J 37/28
See application file for complete search history.

(56) References Cited

U.S. PATENT DOCUMENTS 6,486,471 B1 * 11/2002 Oi ........................... H01J 37/30
250/309
2004/0011959 A1    1/2004 Koike et al.
(Continued)

FOREIGN PATENT DOCUMENTS

CN    1404617 A    3/2003
JP    9-61385 A    3/1997
(Continued)

OTHER PUBLICATIONS

International Search Report (PCT/ISA/210) issued in PCT Application No. PCT/JP2017/031789 dated Nov. 21, 2017 with English translation (four (4) pages).
(Continued)

*Primary Examiner* — David E Smith
(74) *Attorney, Agent, or Firm* — Crowell & Moring LLP (57) ABSTRACT

The present invention provides a charged particle beam apparatus capable of efficiently reducing the effect of a residual magnetic field when SEM observation is performed. The charged particle beam apparatus according to the present invention includes a first mode for passing a direct current to a second coil after turning off a first coil, and a second mode for passing an alternating current to the second coil after turning off the first coil.

9 Claims, 5 Drawing Sheets (51) Int. Cl.
*H01J 37/20* (2006.01)
*H01J 37/244* (2006.01)
(52) U.S. Cl.
CPC .............. *H01J 2237/141* (2013.01); *H01J 2237/31749* (2013.01)

(56) References Cited

U.S. PATENT DOCUMENTS

| | | |
|---|---|---|
| 2008/0067396 A1 | 3/2008 | Ohshima et al. |
| 2010/0258722 A1 | 10/2010 | Fang et al. |
| 2015/0021476 A1 | 1/2015 | Shanel |
| 2016/0329186 A1 | 11/2016 | Li et al. |
| 2017/0040139 A1* | 2/2017 | Nomaguchi ............ H01J 37/28 |

FOREIGN PATENT DOCUMENTS

| | | | |
|---|---|---|---|
| JP | 11-329320 A | | 11/1999 |
| JP | 2003-338259 A | | 11/2003 |
| JP | 2003338259 A | * | 11/2003 |
| JP | 2004-55239 A | | 2/2004 |
| JP | 2005-78899 A | | 3/2005 |
| JP | 2013-65484 A | | 4/2013 |
| WO | WO 01/56056 A2 | | 8/2001 |
| WO | WO-2013015311 A1 | * | 1/2013 ............ H01J 37/141 |
| WO | WO 2015/166849 A1 | | 11/2015 |

OTHER PUBLICATIONS

Japanese-language Written Opinion (PCT/ISA/237) issued in PCT Application No. PCT/JP2017/031789 dated Nov. 21, 2017 (five (5) pages).
Chinese-language Notice of Allowance issued in Chinese Application No. 201780094118.7 dated Jun. 1, 2022 with partial English translation (six (6) pages).
Japanese-language Office Action issued in Japanese Application No. 2019-538911 dated Nov. 17, 2020 with English translation (eight (8) pages).
German-language Office Action issued in German Application No. 11 2017 007 776.1 dated Oct. 31, 2022 with partial English translation (11 pages).

* cited by examiner

CHARGED PARTICLE BEAM DEVICE

TECHNICAL FIELD

The present invention relates to a charged particle beam apparatus.

BACKGROUND ART

An FIB-SEM apparatus is a composite charged particle beam apparatus in which a focused ion beam (FIB) irradiation unit and a scanning electron microscope (SEM) are disposed in the same specimen chamber. The FIB-SEM apparatus is used for preparing a thin film specimen to be observed by using a transmission electron microscope and analyzing a three-dimensional structure of the specimen. Since the SEM has a smaller probe beam diameter than the FIB, the specimen can be observed with high resolution.

The FIB-SEM apparatus performs processing by FIB and observation by SEM alternately or simultaneously. At this time, if a magnetic field leaks from an SEM objective lens to the FIB-SEM specimen chamber, an FIB ion beam is deflected or the isotopes of an ion source are separated, thereby deteriorating the processing accuracy and resolution. Even if the magnetic lens of the SEM lens column is turned off, a residual magnetic field may remain in a pole piece, and the residual magnetic field may leak into the specimen chamber and affect processing and observation by FIB.

JP-A-11-329320 (PTL 1) below discloses a residual magnetic field of a combined charged particle beam apparatus. The document discloses a technique of "a combined charged particle beam apparatus provided with at least one focused ion beam column and at least one electron beam column in the same specimen chamber, including an attenuation AC circuit for demagnetizing a residual magnetic of an objective lens of the electron beam column and having a function of storing an excitation current value of the objective lens of the electron beam column" as a challenge of "preventing mass separation of the focused ion beam due to the residual magnetic field and improving reproducibility of focusing an electron beam" (claim 2).

CITATION LIST

Patent Literature

PTL 1: JP-A-11-329320

SUMMARY OF INVENTION

Technical Problem

When demagnetizing a residual magnetic field by using a damped alternating magnetic field as in the above-described JP-A-11-329320 (PTL 1), it takes about several seconds to demagnetize the residual magnetic field to a level at which the influence on the processing and observation by FIB is acceptable. Therefore, in order to use the charged particle beam apparatus efficiently, it is required to efficiently reduce the effect of the residual magnetic field.

The present invention has been made in view of the above problem, and provides a charged particle beam apparatus capable of efficiently reducing the effect of a residual magnetic field when SEM observation is performed.

Solution to Problem

The charged particle beam apparatus according to the present invention includes a first mode for passing a direct current to a second coil after turning off a first coil, and a second mode for passing an alternating current to the second coil after turning off the first coil.

Advantageous Effects of Invention

According to the charged particle beam apparatus according to the present invention, it is possible to efficiently reduce the effect of the residual magnetic field by properly using the first mode and the second mode according to the application of the charged particle beam apparatus.

DESCRIPTION OF EMBODIMENTS

Embodiment 1

Figure 1:
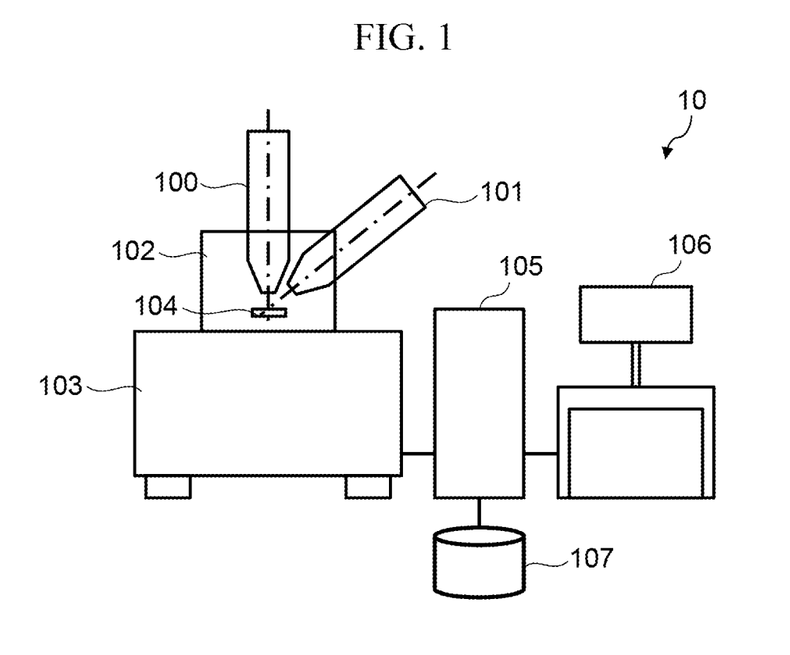
FIG. 1 is a configuration diagram of a charged particle beam apparatus 10 according to Embodiment 1.

FIG. 1 is a configuration diagram of the charged particle beam apparatus 10 according to Embodiment 1 of the present invention. It is a diagram showing the structure of a FIB-SEM apparatus. The charged particle beam apparatus 10 is configured as an FIB-SEM apparatus. The charged particle beam apparatus 10 includes the SEM column 100, an FIB column 101, a specimen chamber 102, an FIB-SEM frame 103, a controller 105, a monitor 106, a storage device 107. The FIB column 101 irradiates a specimen 104 with FIB in order to process or observe the specimen 104. The SEM column 100 irradiates the specimen 104 with an electron beam in order to observe and analyze the specimen 104 with high resolution. The specimen chamber 102 is a space in which the specimen 104 is installed, and includes the above-described lens columns. The FIB-SEM frame 103 is equipped with the specimen chamber 102. The controller 105 controls the charged particle beam apparatus 10 to acquire an SEM observation image of the specimen 104, process the specimen 104 by FIB, and acquire an FIB observation image of the specimen 104. The monitor 106 displays a processing result (for example, an observation image) for the specimen 104 on a screen.

The FIB column 101 includes an ion source, a blanker, an electrostatic deflector, and an electrostatic objective lens. The blanker is used to prevent the ion beam from being irradiated onto the specimen 104 while the FIB column 101 is operated. The electrostatic deflector is for deflecting the ion beam with the lens center of the electrostatic objective lens as a base point and scanning the surface of the specimen 104. As the electrostatic deflector, a single-stage deflector or upper and lower two-stage deflectors can be used.

The SEM column 100 includes an electron gun, a condenser lens, a movable diaphragm, a deflector, and an objective lens. As the electron gun, a filament method, a Schottky method, a field emission method, or the like can be used. As the deflector, a magnetic deflection type or electrostatic deflection type is used. A single-stage deflector or a upper and lower two-stage deflector can be used. As the objective lens, a magnetic lens using an electron focusing effect by a magnetic field, an electric field superposition type magnetic lens in which chromatic aberration is reduced by superimposing a magnetic field and an electric field, and the like can be used.

The specimen 104 is mounted on a tiltable specimen stage provided in the specimen chamber 102. When processing the specimen 104 by FIB, the specimen 104 is tilted toward the FIB column 101, and when observing the specimen 104 by SEM, the specimen 104 is tilted toward the SEM column 100. When applying a bias voltage to the specimen 104 during SEM observation, in consideration of the distortion of the electric field formed between the specimen 104 and the SEM column 100, the specimen 104 is disposed so as to be perpendicular to the central axis of the SEM column 100.

The controller 105 scans a primary electron beam generated from the electron gun on the specimen 104 by the deflector, and acquires an SEM observation image by detecting secondary electrons generated from the inside of the specimen 104 with a secondary electron detector (mounted in the SEM column 100 or the specimen chamber 102). The controller 105 processes the specimen 104 by irradiating the specimen 104 with an ion beam from the ion source and acquires an FIB observation image of the specimen 104. The FIB observation image can be acquired by the same method as the SEM observation image.

The storage device 107 is a device such as a hard disk drive, for example. The storage device 107 stores data used by the controller 105. For example, it is possible to store an instruction for specifying which of a first mode and a second mode described later is to be performed.

Figure 2:
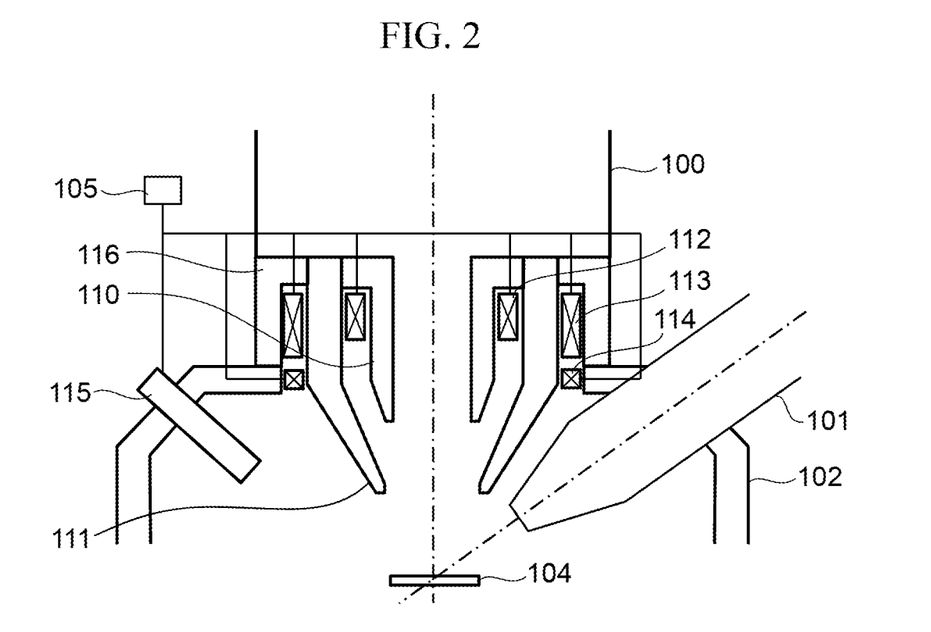
FIG. 2 is a side diagram showing a configuration of an objective lens provided in an SEM column 100.

FIG. 2 is a side diagram showing a configuration of an objective lens provided in the SEM column 100. The objective lens includes a first magnetic pole piece 110, a second magnetic pole piece 111, a first coil 112, and a third magnetic pole piece 116. The first magnetic pole piece 110 and the second magnetic pole piece 111 can be formed of a hollow cylindrical magnetic material. The electron beam passes through the hollow part. The first magnetic pole piece 110 and the second magnetic pole piece 111 are formed symmetrically about the electron beam path as the central axis. The second magnetic pole piece 111 is disposed outside the first magnetic pole piece 110 when viewed from the electron beam path. The end of the second magnetic pole piece 111 on the specimen 104 side extends to a position closer to the specimen 104 than the end of the first magnetic pole piece 110 on the specimen 104 side.

The first coil 112 is disposed between the first magnetic pole piece 110 and the second magnetic pole piece 111. The controller 105 adjusts the magnetic flux generated from the first magnetic pole piece 110 by controlling the value of the current flowing through the first coil 112. Thereby, the characteristic of a magnetic lens can be controlled and a non-immersion type magnetic lens described later can be formed.

A second coil 113 is disposed outside the second magnetic pole piece 111 when viewed from the electron beam path (the central axis of each magnetic pole piece). The SEM column 100 may include the second coil 113, or the second coil 113 may be disposed in the specimen chamber 102. The controller 105 adjusts the magnetic flux generated from the second magnetic pole piece 111 by controlling the value of the current to be passed to the second coil 113. Thereby, the characteristic of a magnetic lens can be controlled and an immersion type magnetic lens described later can be formed.

The third magnetic pole piece 116 is disposed outside the second magnetic pole piece 111 when viewed from the electron beam path. The second magnetic pole piece 111 and the third magnetic pole piece 116 form a magnetic path surrounding the second coil 113.

A third coil 114 is disposed outside the second magnetic pole piece 111 when viewed from the electron beam path, and is used to suppress the residual magnetic field by a method described later. As the third coil 114, as compared with the first coil 112 and the second coil 113, a coil having a small number of turns of the coil wire can be used. The third coil 114 can be configured as a part of the SEM column 100 or can be disposed in the specimen chamber 102.

A magnetic field detector 115 is disposed in the specimen chamber 102 and can measure the magnetic field in the specimen chamber 102. The controller 105 controls the current value of each coil by using the magnetic field in the specimen chamber 102 measured by the magnetic field detector 115.

Figure 3A:
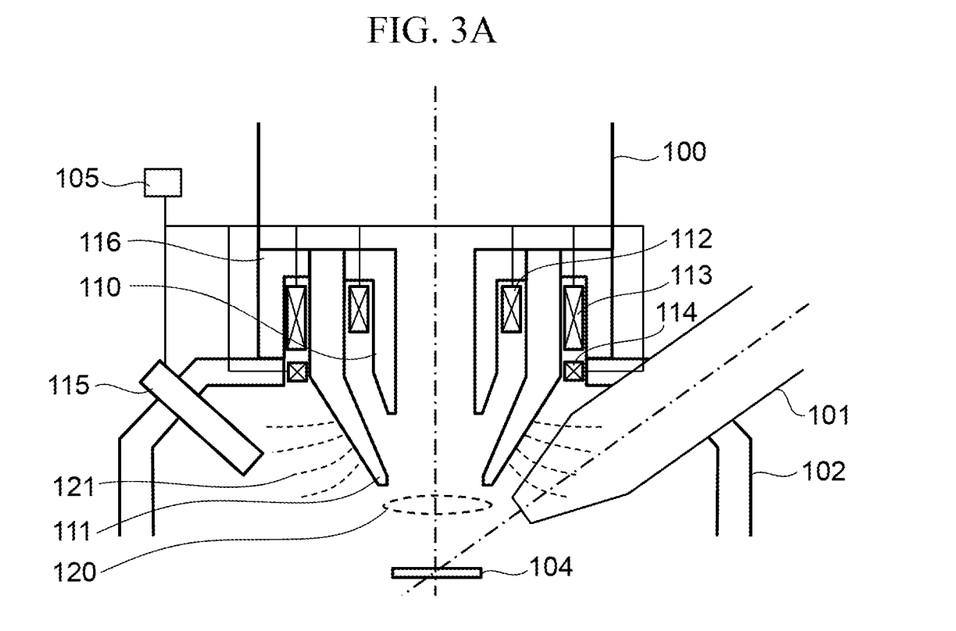
FIG. 3A is a schematic diagram showing a magnetic field generated when an objective lens is formed as an immersion type magnetic lens.

FIG. 3A is a schematic diagram showing a magnetic field generated when an objective lens is formed as an immersion type magnetic lens. An immersion type magnetic lens 120 is formed between the SEM column 100 and the specimen 104 by passing a current to the second coil 113. Since the lens main surface of the immersion magnetic field lens 120 is in the vicinity of the specimen 104, the specimen 104 can be observed with high resolution by shortening the focal length of the lens. On the other hand, when an immersion type magnetic lens is formed, a strong lens magnetic field 121 is generated in the specimen chamber 102 from the second magnetic pole piece 111, thus the FIB is affected by the lens magnetic field 121. Therefore, processing and observation by FIB cannot be performed at this time.

Figure 3B:
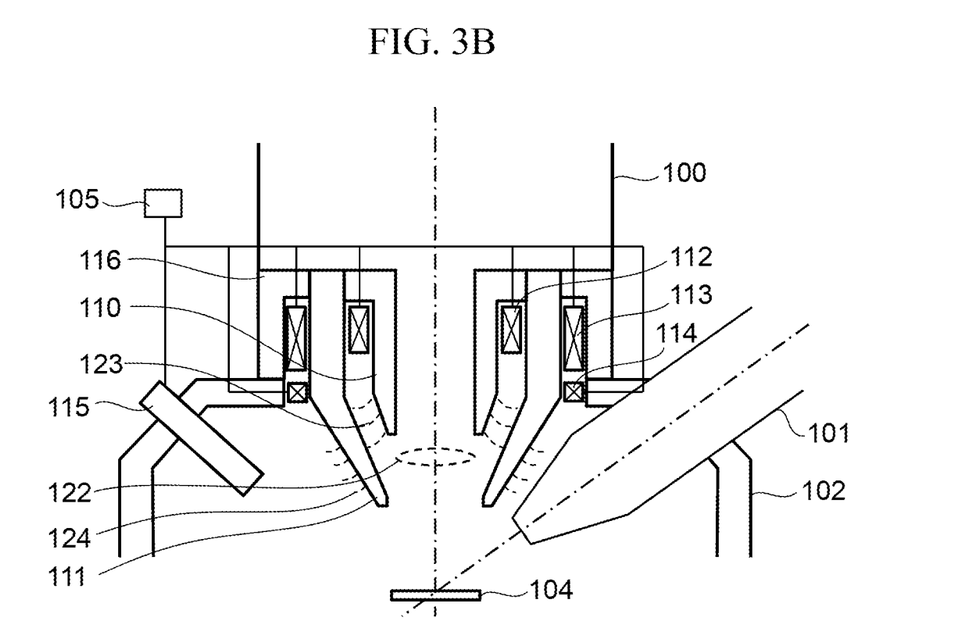
FIG. 3B is a schematic diagram showing a magnetic field generated when an objective lens is formed as a non-immersion type magnetic lens.

FIG. 3B is a schematic diagram showing a magnetic field generated when an objective lens is formed as a non-immersion type magnetic lens. An immersion type magnetic lens 122 is formed between the SEM column 100 and the specimen 104 by passing a current to the first coil 112. Since the lens main surface of the non-immersion type magnetic lens 122 is between the end of the first magnetic pole piece 110 and the end of the second magnetic pole piece 111, a lens magnetic field 123 is blocked by the second magnetic pole piece 111. Therefore, the influence of the magnetic field on the FIB is small as compared with the immersion type magnetic lens. However, even in the non-immersion type magnetic lens 122, a magnetic field (leakage magnetic field 124) may leak into the specimen chamber 102 due to the shape and positional relationship of the magnetic pole pieces. This leakage magnetic field 124 causes a FIB image shift and resolution deterioration.

Figure 4:
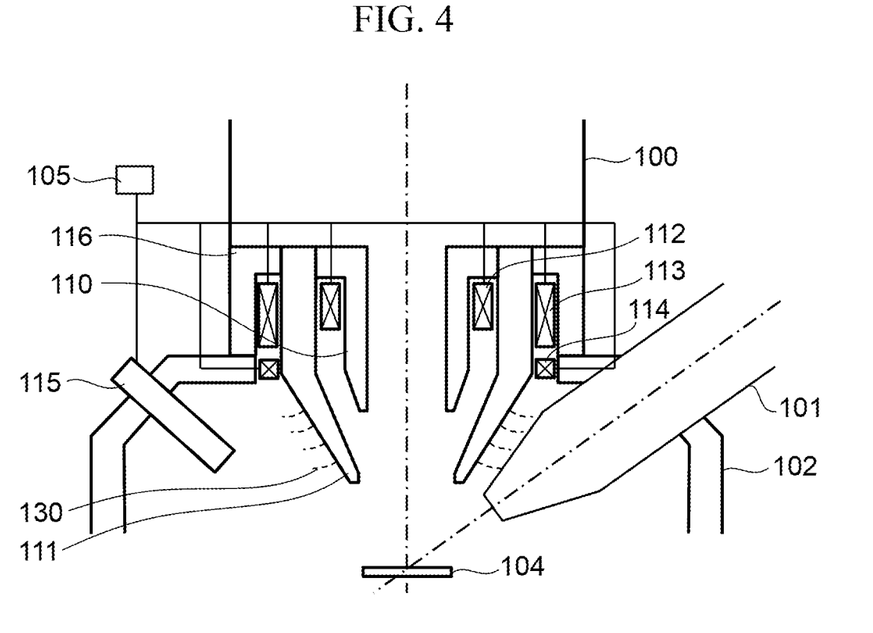
FIG. 4 is a schematic diagram showing a residual magnetic field when the objective lens is turned off.

FIG. 4 is a schematic diagram showing a residual magnetic field when the objective lens is turned off. When the current flowing through the first coil 112 is turned off, the non-immersion type magnetic lens 122 is turned off, and when the current flowing through the second coil 113 is turned off, the immersion type magnetic lens 120 is also turned off. At this time, the residual magnetic field 130 remains in the specimen chamber 102. When the residual magnetic field 130 exists in the FIB path or in the vicinity thereof, a Lorentz force acts on the ion beam, and the ion beam is deflected in a direction orthogonal to the traveling direction of the ion beam and the magnetic flux direction of the magnetic field.

The residual magnetic field 130 changes according to the use state of the objective lens of the SEM column 100. Therefore, the shift amount of the ion beam on the surface of the specimen 104 due to the residual magnetic field 130 has a variation of several nanometers to several tens of nanometers, which is a factor that deteriorates the FIB processing accuracy. Since the immersion magnetic lens 120 has a high density of magnetic flux flowing through the second magnetic pole piece 111, the residual magnetic field is larger than that of the non-immersion magnetic lens 122 (approximately 1 mT or more). Therefore, in Embodiment 1, when the magnetic lens is switched between the immersion magnetic lens 120 and the non-immersion magnetic lens 122, the second coil 113 or the third coil 114 is used to cancel the effect of the residual magnetic field 130.

Figure 5:
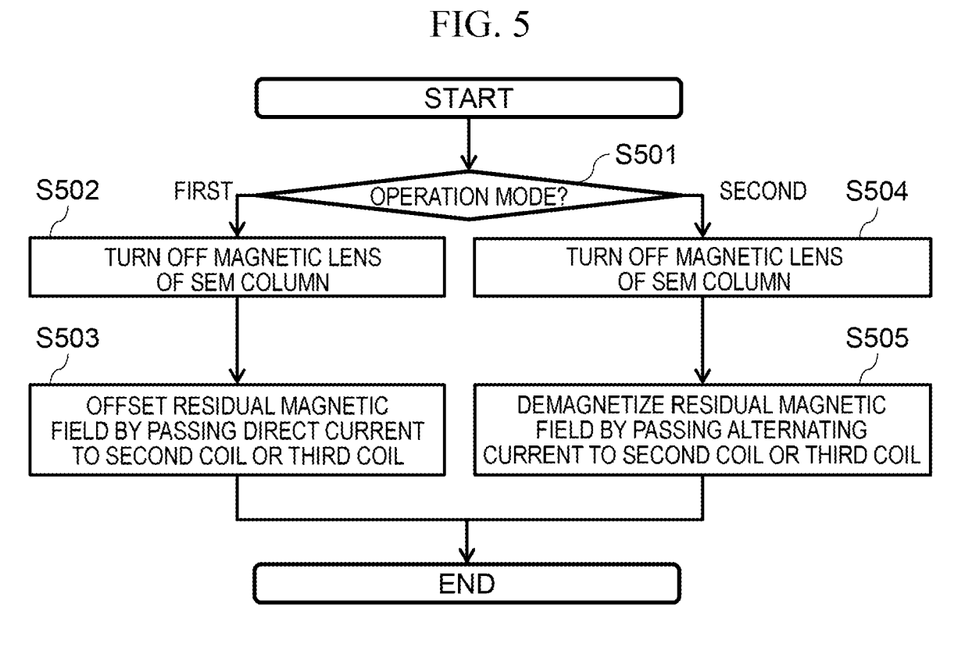
FIG. 5 is a flowchart showing a procedure in which the charged particle beam device 10 suppresses the effect of a residual magnetic field 130.

FIG. 5 is a flowchart showing a procedure in which the charged particle beam device 10 suppresses the effect of a residual magnetic field 130. The charged particle beam apparatus 10 can perform two operation modes: (a) a first mode for performing the processing and observation by FIB while suppressing the effect of the residual magnetic field 130 by a direct current, and (b) a second mode for performing the processing and observation by FIB after demagnetizing the residual magnetic field 130 as much as possible by an alternating current. For example, the controller 105 can perform this flowchart when (a) the magnetic lens is switched between the immersion magnetic lens 120 and the non-immersion magnetic lens 122, or (b) when the operator gives an instruction. Hereinafter, each step of FIG. 5 will be described.

(FIG. 5: Step S501)

The controller 105 determines whether to perform the first mode or the second mode in accordance with the given instruction. When the first mode is performed, the process proceeds to step S502, and when the second mode is performed, the process proceeds to step S504. An instruction can be given by the operator via, for example, a graphical user interface (GUI) to be described later, and an operation mode is specified in advance according to the type of the specimen 104 and the contents of processing and observation to be performed, and the specification is stored in the storage device 107 as an instruction, and the controller 105 can read the instruction out. The instruction may be given by any other appropriate method. In any case, the charged particle beam apparatus 10 once stores the given instruction in the storage device 107, and the controller 105 reads the instruction out.

(FIG. 5: Step S502)

The controller 105 turns off the objective lens (the immersion magnetic lens 120 or the non-immersion magnetic lens 122) of the SEM column 100. Specifically, the current of the coil (first coil 112 or second coil 113) forming the magnetic lens is turned off.

(FIG. 5: Step S503)

The controller 105 generates a magnetic field that offsets the residual magnetic field 130 by passing a direct current to the second coil 113 or the third coil 114. The direction of the direct current is a direction in which a magnetic field that cancels the effect of the residual magnetic field 130 is generated. The magnitude of the direct current can be determined by the magnetic field detector 115 measuring the magnitude of the residual magnetic field 130, or can be determined based on the amount by which the position of the FIB observation image is shifted by the residual magnetic field 130. Other suitable methods may be used.

(FIG. 5: Step S503: Supplement No. 1)

Since the first mode only generates a magnetic field that cancels the influence of the residual magnetic field 130, the first mode is more effective than the second mode described later. However, since the residual magnetic field 130 is not completely removed, for example, it can be said that it is suitable to use the first mode after using the non-immersion type magnetic lens 122 having a small residual magnetic field 130 or in an application (for example, rough processing) where the processing accuracy requirement by FIB is not so high.

(FIG. 5: Step S503: Supplement 2)

It is possible to perform the first mode by using one or both of the second coil 113 and the third coil 114 after forming the non-immersion type magnetic lens 122 by using the first coil 112. After the immersion magnetic lens 120 is formed by using the second coil 113, the first mode can be performed by using the third coil 114.

(FIG. 5: Step S503: Supplement No. 3)

The first mode does not completely demagnetize the residual magnetic field 130, but only suppresses the effect of the residual magnetic field 130 while an offset magnetic field is generated. Therefore, when the FIB is used, the controller 105 performs processing and observation by the FIB while performing the first mode.

(FIG. 5: Step S504)

This step is the same as step S502.

(FIG. 5: Step S505)

The controller 105 demagnetizes the residual magnetic field 130 as much as possible by passing an alternating current to the second coil 113 or the third coil 114. By reducing the amplitude of the alternating current with time, the residual magnetic field 130 remaining in the pole piece can be reduced with time and can be close to zero. An appropriate value may be determined in advance for the amplitude of the alternating current.

(FIG. 5: Step S505: Supplement)

In the second mode, the residual magnetic field 130 is gradually demagnetized while the amplitude of the alternating current is decreased with time, thus it takes about several seconds until the effect of the residual magnetic field 130 on the FIB falls within an allowable range. On the other hand, the second mode has a higher demagnetizing effect than the first mode. Therefore, it can be said that it is appropriate to use the second mode before performing applications that require high processing accuracy by FIB or performing 3D structural analysis.

(FIG. 5: Step S501: Supplement)

The first mode and the second mode may be used in combination. In this case, in step S501, an instruction to that effect is received, and the controller 105 uses each mode in combination according to the instruction. For example, after the residual magnetic field 130 is reduced to some extent by the second mode, the residual magnetic field 130 can be offset by the first mode. In this case, the first mode is used for the purpose of correcting the slight residual magnetic field 130 remaining in the second mode. As a result, the same or better accuracy as the second mode can be realized more quickly.

Figure 6:
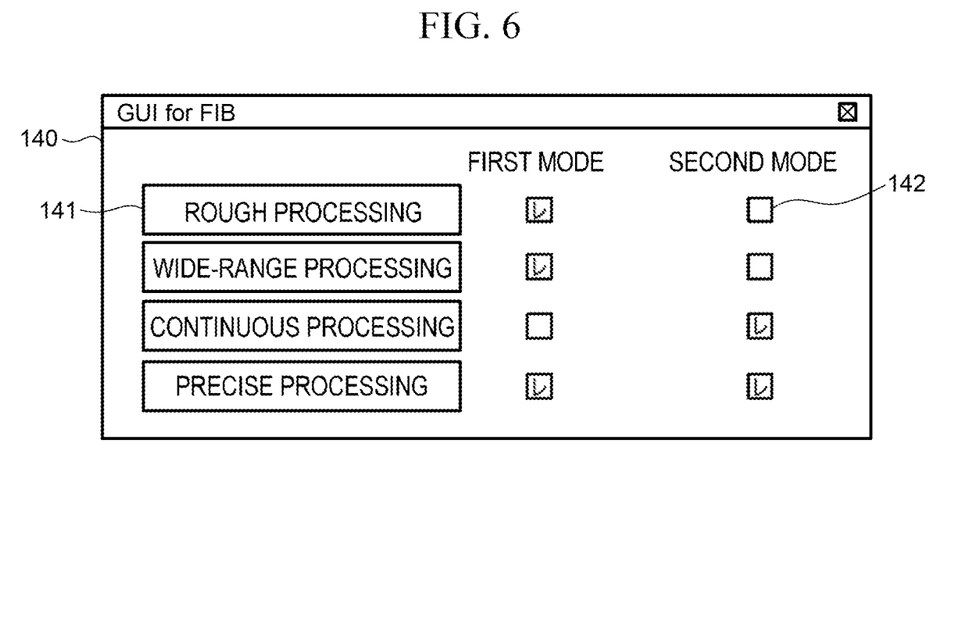
FIG. 6 is an example of a GUI 140 for an operator to give an instruction to the charged particle beam apparatus 10.

FIG. 6 is an example of the GUI 140 for the operator to give an instruction to the charged particle beam apparatus 10. The controller 105 displays a GUI 140 on the monitor 106 on the screen. The operator specifies whether to perform the first mode or the second mode for each processing item via the GUI 140. Both modes can be performed or none can be performed.

The GUI 140 has a processing mode field 141 and an operation mode specification field 142. The processing mode field 141 displays the content of the processing operation. The operation mode specification field 142 is a field for specifying which of the first mode and the second mode is to be performed for each processing operation. For example, in rough processing that does not require much accuracy in FIB processing and wide-range processing for removing the specimen surface by defocusing the ion beam, the operator selects the first mode, and the operator selects the second mode or both modes for precision processing that requires accuracy and continuous processing for a long time.

When the operation of the charged particle beam apparatus 10 is switched from SEM observation to FIB processing and observation, the controller 105 can suppress the effect of the residual magnetic field 130 before using the FIB by automatically executing the flowchart of FIG. 5.

Embodiment 1: Summary

The charged particle beam apparatus 10 according to Embodiment 1 can perform the first mode for reducing the effect of the residual magnetic field 130 by a direct current and the second mode for reducing the effect of the residual magnetic field 130 by an alternating current. As a result, the first mode and the second mode can be selectively used according to the application of the FIB column 101, thus it is possible to achieve both the accuracy of processing and observation by FIB and the operation efficiency.

Embodiment 2

Figure 7:
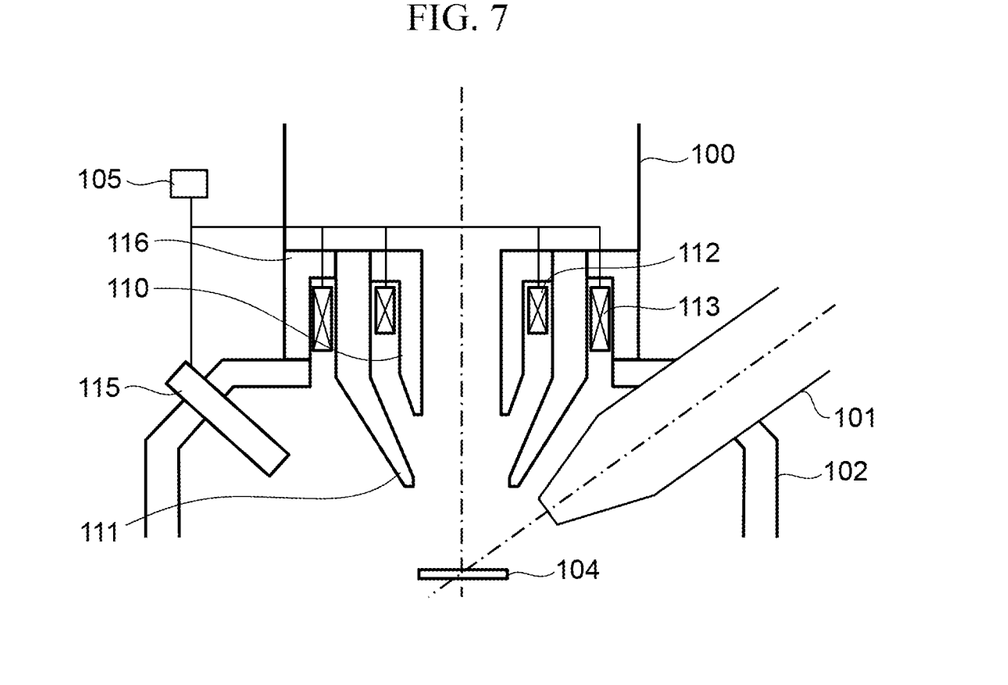
FIG. 7 is a configuration diagram of an objective lens of the SEM column 100 provided in the charged particle beam apparatus 10 according to Embodiment 2.

FIG. 7 is a configuration diagram of an objective lens of the SEM column 100 provided in the charged particle beam apparatus 10 according to Embodiment 2 of the present invention. Unlike Embodiment 1, the charged particle beam apparatus 10 according to Embodiment 2 does not include the third coil 114. Other configurations are the same as those of Embodiment 1. In Embodiment 2, both the first mode and the second mode are performed by using the second coil 113. Since the third coil 114 is not used, the value of the current to be passed to the second coil 113 in each mode may be different from that in Embodiment 1, but the operation procedure is the same as that in Embodiment 1.

The second coil 113 has both the role of forming a magnetic lens and the role of suppressing the residual magnetic field, and thus has the largest number of turns among the three coils. That is, the number of second coil turns the number of first coil turns the number of third coil turns. When only the first coil 112 is used to form the magnetic lens, the number of turns of the second coil 113 may be smaller than that of the first coil 112. That is, the first coil turns the second coil turns.

Embodiment 3

Figure 8:
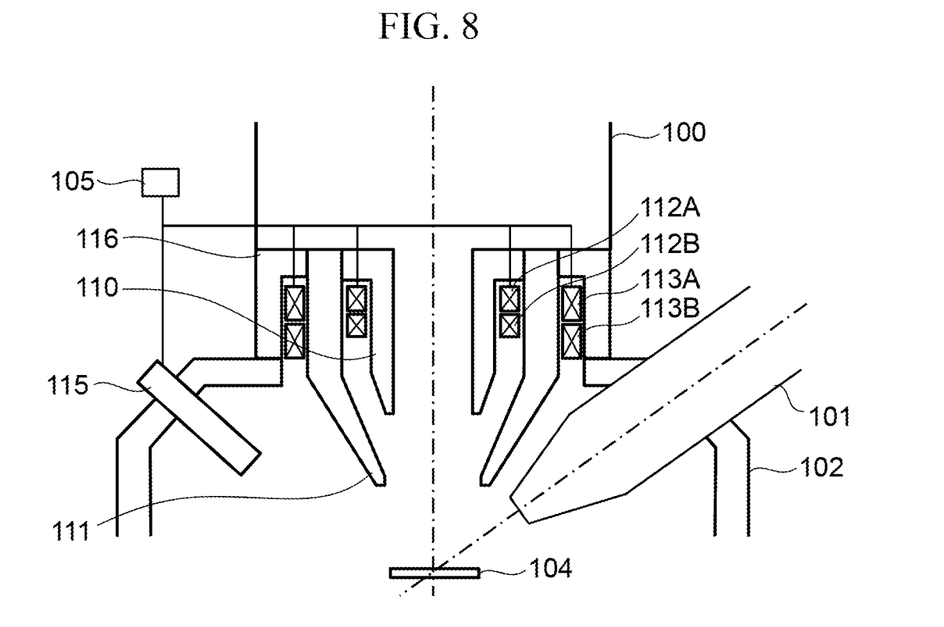
FIG. 8 is a configuration diagram of an objective lens of the SEM column 100 provided in the charged particle beam apparatus 10 according to Embodiment 3.

FIG. 8 is a configuration diagram of an objective lens of the SEM column 100 provided in the charged particle beam apparatus 10 according to Embodiment 3 of the present invention. Either one or both of the first coil 112 and the second coil 113 can be divided into a plurality of coils. FIG. 8 shows an example in which both the first coil 112 and the second coil 113 are divided into two coils.

In order to stabilize the magnetic field generated from the pole piece, it is important to suppress the temperature change of the pole piece. In order to suppress the temperature change of the pole piece, the power consumption of the coil may be kept constant. In order to adjust the magnetic field while keeping the power consumption of the coil constant, it is only necessary to change the direction of the current while keeping the magnitude of the current that is passed to the coil constant. For example, in FIG. 8, the generated magnetic field can be canceled by passing currents in opposite directions to coils 112A and 112B. When generating a magnetic field, currents in the same direction may be supplied to the coils 112A and 112B. In either case, the power consumption can be kept constant by keeping the current value constant.

The number of turns of each divided coil may be the same or different. The current control can be simplified if the number of turns is the same. The performance as a coil is the same for both a divided coil and a single coil.

Modification Example of Present Invention

The present invention is not limited to the above-described embodiments, and includes various modification examples. For example, the above-described embodiments have been described in detail for easy understanding of the present invention, and are not necessarily limited to those having all the configurations described. A part of the configuration of one example can be replaced with the configuration of another example, and the configuration of another example can be added to the configuration of one example. It is possible to add, delete, and replace other configurations for a part of the configuration of each example.

In the above embodiment, the example in which the residual magnetic field of the SEM column 100 affects the FIB has been described. The residual magnetic field of the SEM column 100 also affects the next time the SEM column 100 is used. Therefore, the method of the present invention is useful even when FIB is not used.

In the above embodiments, the controller 105 can be configured by using hardware such as a circuit device that implements the function, or can be configured by an arithmetic unit executing software that implements the function.

REFERENCE SIGNS LIST

10: charged particle beam apparatus
100: SEM column
101: FIB column
102: specimen chamber
103: FIB-SEM frame
104: specimen
105: controller
106: monitor
110: first pole piece
111: second pole piece
112: first coil
113: second coil
114: third coil
115: magnetic field detector
116: third pole piece

The invention claimed is:

1. A charged particle beam apparatus for irradiating a specimen with a charged particle beam, the apparatus comprising:
an electron beam irradiation unit that emits an electron beam to the specimen; and
an objective lens for focusing the electron beam on the specimen, wherein
the objective lens includes
a first magnetic pole piece,
a second magnetic pole piece that is disposed at a position away from an electron beam path with respect to the first magnetic pole piece,
a first coil that is disposed between the first magnetic pole piece and the second magnetic pole piece, and
a second coil that is disposed at a position away from an electron beam path with respect to the first magnetic pole piece,
the charged particle beam apparatus further comprises:
a control unit that controls a current to be passed to the first coil and a current to be passed to the second coil; and
a storage unit that stores an instruction to the control unit, wherein
according to the instruction stored in the storage unit, the control unit performs at least one of a first mode for reducing an effect of a residual magnetic field remaining in the second magnetic pole piece by passing a direct current to the second coil after turning off a current flowing through to the first coil and a second mode for reducing an effect of a residual magnetic field remaining in the second magnetic pole piece by passing an alternating current to the second coil after turning off a current flowing through to the first coil; and
an ion beam irradiation unit that emits a focused ion beam to the specimen, wherein
the control unit irradiates the specimen with the focused ion beam by controlling the ion beam irradiation unit while performing the first mode to process the specimen.

2. The charged particle beam apparatus according to claim 1, wherein
the control unit reduces a residual magnetic field remaining in the second magnetic pole piece with time by reducing an amplitude of the alternating current with time while the second mode is being performed.

3. The charged particle beam apparatus according to claim 1, wherein
the control unit is configured to be switchable between a first magnetic lens mode for forming a magnetic lens by passing a current to the first coil and a second magnetic lens mode for forming a magnetic lens by passing a current to the second coil, and
the control unit performs at least one of the first mode and the second mode when an operation mode is switched between the first magnetic lens mode and the second magnetic lens mode.

4. The charged particle beam apparatus according to claim 1, further comprising:
a third coil that is disposed at a position away from the electron beam path with respect to the second magnetic pole piece, wherein
according to the instruction stored in the storage unit, the control unit performs at least one of a third mode for reducing an effect of a residual magnetic field remaining in the second magnetic pole piece by passing a direct current to the third coil after turning off the current flowing through the first coil and the current flowing through the second coil and a fourth mode for reducing an effect of the residual magnetic field remaining in the second magnetic pole piece by passing an alternating current to the third coil after turning off the current flowing through the first coil and the current flowing through the second coil.

5. The charged particle beam apparatus according to claim 4, further comprising:
a third magnetic pole piece that is disposed at a position away from the electron beam path with respect to the second coil, wherein
the second magnetic pole piece and the third magnetic pole piece form a magnetic path surrounding the second coil.

6. The charged particle beam apparatus according to claim 1,
wherein at least one of the first coil and the second coil is formed by a plurality of coils.

7. The charged particle beam apparatus according to claim 4, wherein
the number of turns of the second coil is equal to or greater than the number of turns of the first coil, and
the number of turns of the first coil is equal to or greater than the number of turns of the third coil.

8. The charged particle beam apparatus according to claim 1, wherein
the number of turns of the second coil is equal to or greater than the number of turns of the first coil.

9. A charged particle beam apparatus for irradiating a specimen with a charged particle beam, the apparatus comprising:
an electron beam irradiation unit that emits an electron beam to the specimen; and
an objective lens for focusing the electron beam on the specimen, wherein
the objective lens includes
a first magnetic pole piece,
a second magnetic pole piece that is disposed at a position away from an electron beam path with respect to the first magnetic pole piece,
a first coil that is disposed between the first magnetic pole piece and the second magnetic pole piece, and
a second coil that is disposed at a position away from an electron beam path with respect to the first magnetic pole piece,
the charged particle beam apparatus further comprises:
a control unit that controls a current to be passed to the first coil and a current to be passed to the second coil; and
a storage unit that stores an instruction to the control unit, wherein
according to the instruction stored in the storage unit, the control unit performs at least one of a first mode for reducing an effect of a residual magnetic field remaining in the second magnetic pole piece by passing a direct current to the second coil after turning off a current flowing through to the first coil and a second mode for reducing an effect of a residual magnetic field remaining in the second magnetic pole piece by passing an alternating current to the second coil after turning off a current flowing through to the first coil;
an ion beam irradiation unit that emits a focused ion beam to the specimen; and
a user interface for inputting an instruction to the control unit, wherein the user interface has a specification field for specifying which of the first mode and the second mode is to be performed when the specimen is processed by using the focused ion beam, and according to the instruction entered for the specification field, the control unit performs at least one of the first mode and the second mode when processing the specimen by using the focused ion beam.

* * * * *